(12) United States Patent
Kang

(10) Patent No.: US 6,978,984 B2
(45) Date of Patent: Dec. 27, 2005

(54) RAW MATERIAL PROVIDING DEVICE FOR CHEMICAL VAPOR DEPOSITION PROCESS

(75) Inventor: Gu-Young Kang, Kumi-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 226 days.

(21) Appl. No.: 10/453,006

(22) Filed: Jun. 3, 2003

(65) Prior Publication Data

US 2003/0235389 A1  Dec. 25, 2003

(30) Foreign Application Priority Data

Jun. 25, 2002  (KR) ................................ 2002-35604

(51) Int. Cl.[7] .............................................. B01F 3/04
(52) U.S. Cl. ..................... 261/135; 261/142; 261/72.1; 261/122.1; 261/DIG. 65
(58) Field of Search ............................. 261/69.1, 72.1, 261/122.1, 134, 135, 137, 142, DIG. 65

(56) References Cited

U.S. PATENT DOCUMENTS

| | | | |
|---|---|---|---|
| 4,545,801 A | * | 10/1985 | Miyajiri et al. ................ 65/157 |
| 4,582,480 A | | 4/1986 | Lynch et al. .................... 432/1 |
| 4,859,375 A | | 8/1989 | Lipisko et al. ................. 261/20 |
| 5,035,200 A | * | 7/1991 | Moriyama et al. .......... 118/693 |
| 5,279,338 A | * | 1/1994 | Goossens ..................... 141/95 |
| 5,700,401 A | * | 12/1997 | Weinberg et al. .............. 261/27 |
| 5,938,985 A | * | 8/1999 | Rodgers ..................... 261/131 |
| 6,134,941 A | * | 10/2000 | Cripe et al. .................. 73/1.02 |
| 6,635,114 B2 | * | 10/2003 | Zhao et al. .................. 118/715 |
| 6,660,096 B2 | * | 12/2003 | Takeshita et al. ........... 118/726 |

* cited by examiner

*Primary Examiner*—Scott Bushey
(74) *Attorney, Agent, or Firm*—Cha & Reiter, L.L.C.

(57) ABSTRACT

Disclosed is a raw material-providing device for a chemical-vapor deposition process and includes: a bubbler for vaporizing liquid raw material and providing the vaporized raw material to a deposition unit; and a raw material tank for providing liquid raw material to the bubbler, wherein the raw material tank preserves liquid raw material to be provided to the bubbler in advance and preheats the liquid raw material, and the raw material inside the raw material tank is provided to the bubbler through a plurality of hollow micro tubes, and wherein as the raw material inside the bubbler is gradually consumed, the internal pressure of the raw material tank is adjusted to change the amount of the raw material to be provided to the bubbler, thereby adjusting the amount of the raw material inside the bubbler and the vapor pressure inside the bubbler.

11 Claims, 3 Drawing Sheets

RAW MATERIAL PROVIDING DEVICE FOR CHEMICAL VAPOR DEPOSITION PROCESS

CLAIM OF PRIORITY

This application claims priority to an application entitled "Raw material providing device for chemical vapor deposition process," filed in the Korean Intellectual Property Office on Jun. 25, 2002 and assigned Serial No. 02-35604, the contents of which are hereby incorporated by reference.

BACKGROUND OF THE INVENTION

1. Field of the Invention

The present invention generally relates to an optical-fiber preform and, more particularly, to a device for providing a raw material during a chemical-vapor deposition process.

2. Description of the Related Art

Optical communication, which uses an optical fiber as a transmission medium, can transfer a vast amount of information at a faster rate than an electric communication system. Also, better quality communication is possible as the optical communication is free of interference from radios or magnetic fields.

For fabricating an optical fiber, which is drawn from an optical preform, there are sol-gel method and vapor-phase deposition method. The sol-gel method involves converting a liquid raw material into a mold to gelify the liquid raw material, then sintering the gel material to manufacture a silica glass. As the entire process occurs at low temperature, the production cost is low and relatively easy to make an adjustment in the composition of the fiber.

There are different types of vapor-phase deposition method, including a modified-chemical-vapor deposition (MCVD), vapor-phase-axial deposition (VAD), or outside-vapor deposition (OVD). These vapor-phase deposition methods involve heating a designated target rod or a glass tube and, at the same time, supplying raw material in a gas state to produce a suit on the target rod or on the tube, thus producing an optical fiber preform. As a part of the vapor-phase deposition process, the liquid raw material is vaporized in a designated device for holding the raw material and later supplied to an optical-fiber preform deposition path.

FIG. 1 is a simplified diagram of the conventional device 100 for holding the raw material during the chemical-vapor deposition process. Particularly, FIG. 1 introduces a device including a level sensor for sensing the liquid level of the raw material inside a bubbler, thereby sensing whether the raw material has been provided or cut off. As depicted in the drawing, the conventional raw material-providing device 100 for a chemical-vapor deposition process provides carrier gas B to the raw material inside the bubbler 110 to vaporize the liquid raw material to a gas state C, then the vapor is provided to a deposition unit. As the liquid raw material inside the bubbler 110 is provided to the deposition unit after going through the phase change, the bubbler 110 is replenished with raw material. The bubbler 110 includes a raw material providing a pipe 120 for receiving raw material A, a gas pipe 130 for providing carrier gas B, and a vapor pipe 140 for providing the phase change raw material C to the deposition unit. To maintain the temperature of the raw material inside the bubbler 110 uniformly, a thermal sensor 113 and a heater 115 are provided in the bubbler 110.

A level sensor 111, which is mounted in the bubbler 110, is provided for use in maintaining the amount of raw material inside the bubbler 110 within a certain level. As the raw material inside the bubbler 110 is gradually decreased, the level sensor 111 generates a signal for controlling whether the flow of the raw material should be continued or cut off.

However, there is a drawback in the conventional method when the level sensor is used for sensing the amount of raw material inside the bubbler before providing the raw material. In particular, when the raw material is being provided or when the raw material goes through the phase change, the disturbance caused by the raw material inside the bubbler tends to cause the level sensor to malfunction. In addition, the conventional device lowers the overall work efficiency as the deposition process cannot be conducted at the time when the raw material is being received.

Another drawback of the conventional device using a level sensor is that it is difficult to maintain a constant amount of the raw material inside the bubbler because the raw material is designed to replenish whenever the amount of the raw material inside the bubbler is under a certain level. As the amount of the phase-change raw material (i.e., liquid to vapor) is not uniform, it is hard to maintain a constant vapor pressure, and the vapor amount that needs to be provided to the deposition unit is not uniform. As a result, these factors tend to deteriorate the quality of the optical-fiber preform being deposited.

FIG. 2 is a simplified diagram of the conventional device 200 used in a chemical-vapor deposition process, which incorporates a mechanical valve that opens/closes, depending on the weight of the raw material inside a bubbler. As depicted in FIG. 2, the prior-art device 200 includes an external bubbler 210a and an internal bubbler 210b. The internal bubbler 210b is provided with carrier gas B' and vaporizes the liquid raw material to a gas state C' before providing it to a deposition unit. Meanwhile, as the vaporized raw material inside the external and the internal bubblers 210a, and 210b is provided to the deposition unit, the bubblers 210a and 210b are replenished with raw material. To this end, the bubbler 210a, 210b includes a raw material providing pipe 220 for receiving raw material A', a gas pipe 230 for providing carrier gas B', and a vapor pipe 240 for providing the phase change raw material C' to the deposition unit. In addition, to maintain the temperature of the raw material inside the bubbler 210a and 210b uniformly, a thermal sensor 213 and a heater 215 are further provided in the bubbler 210a and 210b. As such, the internal bubbler 210b gradually rises to the surface due to the internal pressure of the providing pipe 220 when the raw material is consumed and eventually opens a pressure-operated valve 225 to provide the raw material to the bubbler 210a and 210b. More details on such raw material-providing device are disclosed in the U.S. Pat. No. 5,938,985.

However, as the pipe used for providing the raw material using a pressure-operated valve must maintain constant pressure therein, the pipe can be easily damaged. In addition, undesirable pollutants can be created between the pressure-operated valve and the inflow opening of the pipe due to mechanical friction.

SUMMARY OF THE INVENTION

It is, therefore, an object of the present invention to provide a raw material-providing device for a chemical-vapor deposition process, which is capable of providing vapor at constant vapor pressure to a deposition unit.

Another object of the present invention is to provide a device for providing raw material during a chemical-vapor deposition process and, more particularly, a device that is capable of providing raw material to a bubbler at a more stable condition.

Still another object of the present invention is to provide a device used in a chemical-vapor deposition process and capable of easily adjusting the pressure of vapor to be provided to a deposition unit.

Accordingly, there is provided a raw material-providing device for a chemical-vapor deposition process, including: a bubbler for vaporizing a liquid raw material and providing the vaporized raw material to a deposition unit; and, a raw material tank for providing liquid raw material to the bubbler, wherein the raw material tank preserves the liquid raw material to be provided to the bubbler in advance and preheats the liquid raw material. The raw material inside the raw material tank is provided to the bubbler through a plurality of hollow microtubes, and as the raw material inside the bubbler is gradually decreased, the internal pressure of the raw material tank is increased for providing the raw material to the bubbler continuously, thereby maintaining the amount of raw material inside the bubbler and the vapor pressure inside the bubbler uniformly.

BRIEF DESCRIPTION OF THE DRAWINGS

The above features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. For the purpose of clarity and simplicity, well-known functions or constructions are not described in detail as they would obscure the invention in unnecessary detail.

Figure 1:
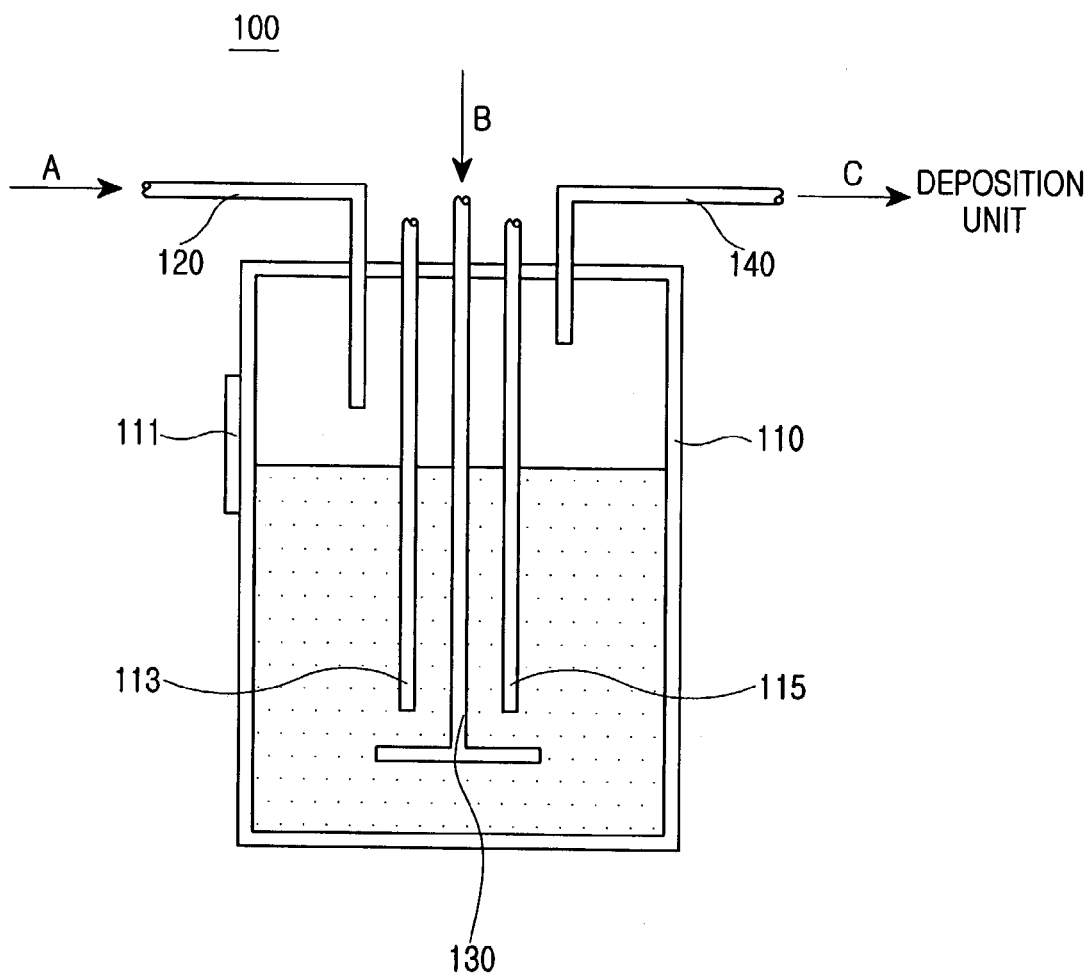
FIG. 1 is an illustrative diagram of a device used in a chemical-vapor deposition process in accordance with an embodiment of a related art.
Figure 2:
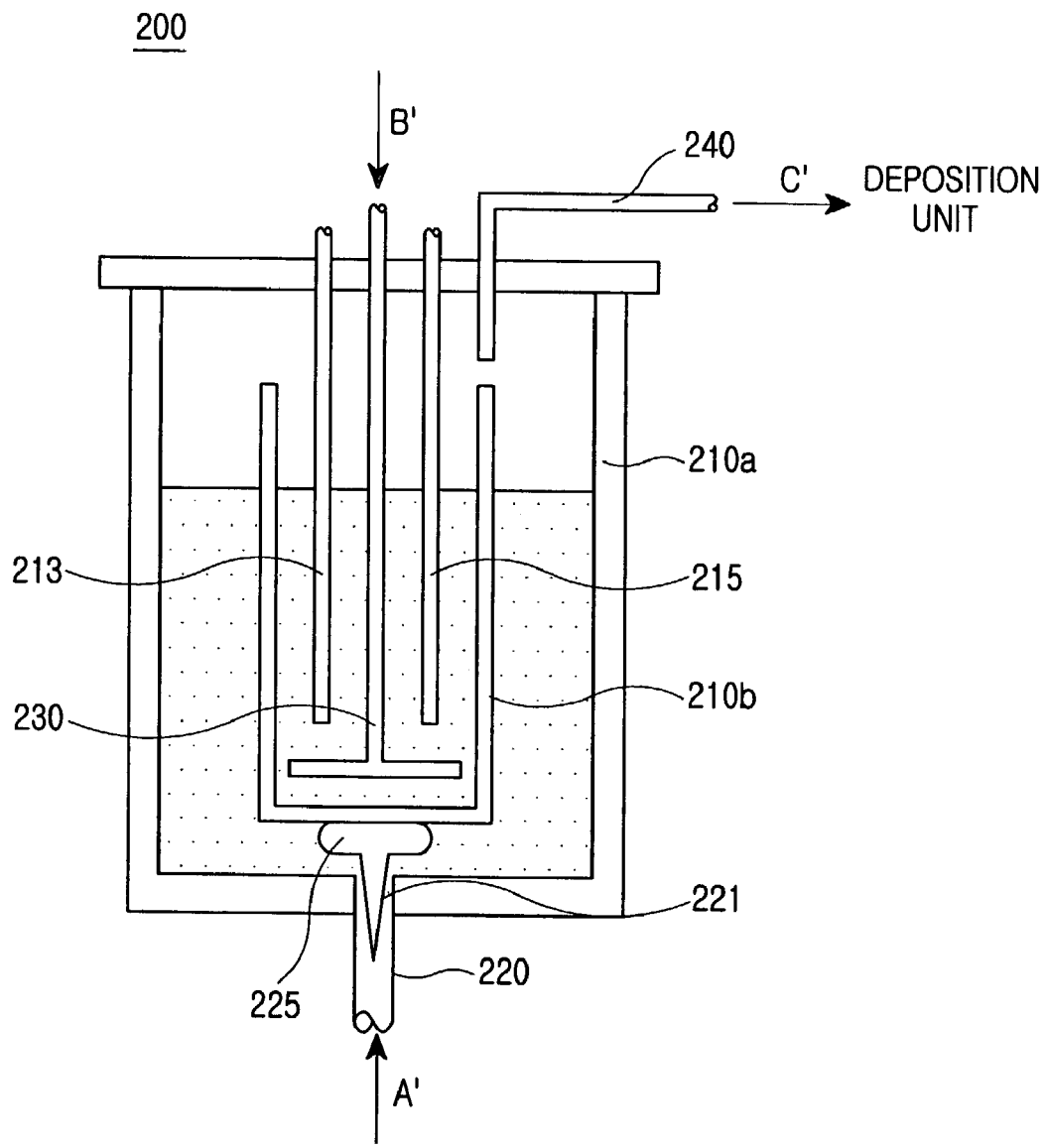
FIG. 2 is an illustrative diagram of a device used in a chemical-vapor deposition process in accordance with another embodiment of a related art; and, FIG. 3 is an illustrative diagram of a device used in a chemical-vapor deposition process in accordance with a preferred embodiment of the present invention.
Figure 3:
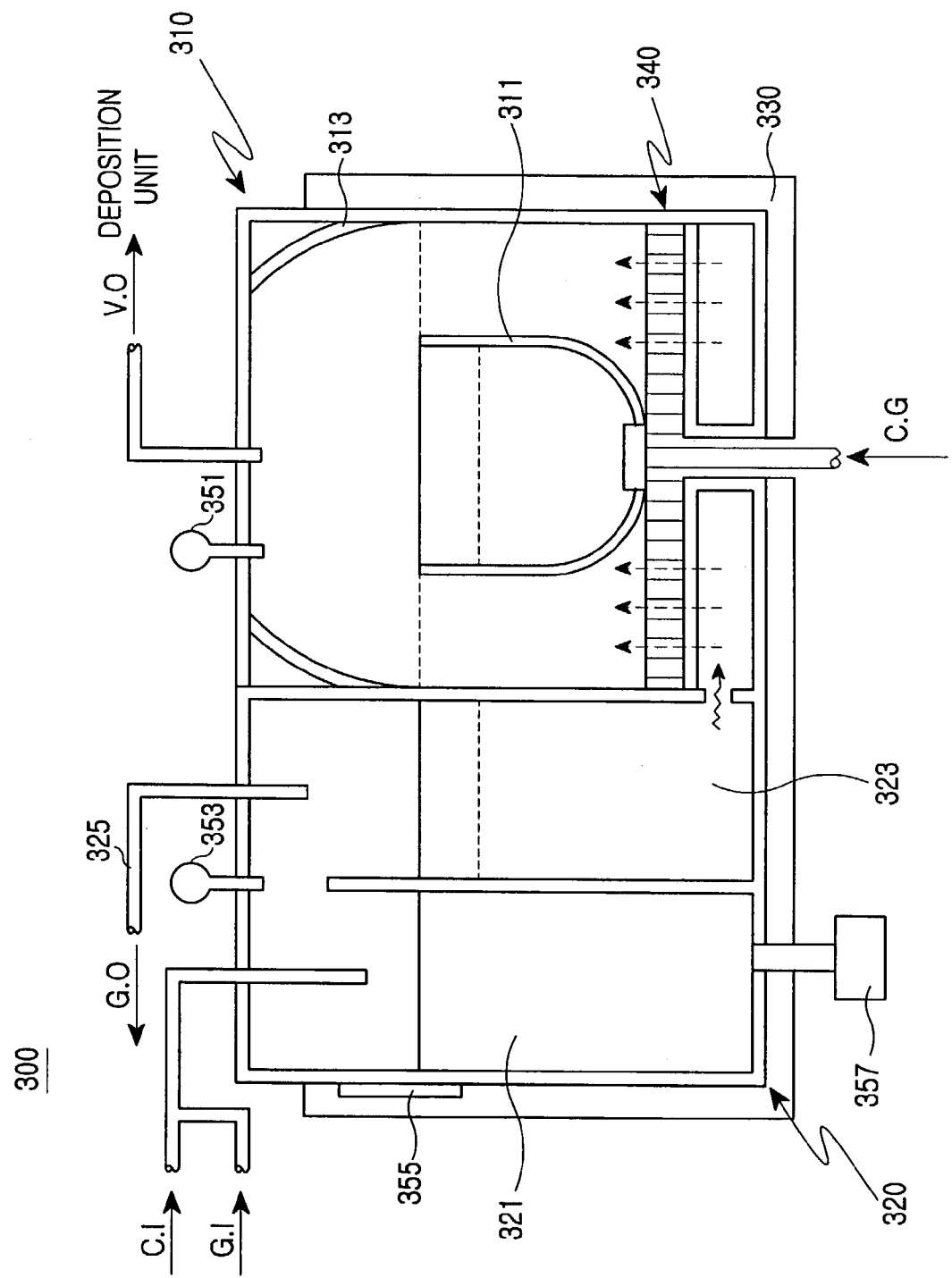

FIG. 3 is an illustrative diagram of the device 300 used in a chemical vapor deposition process in accordance with a preferred embodiment of the present invention. As depicted in the drawing, the device 300 for a chemical-vapor deposition process embodying the teachings of the present invention includes a bubbler 310, a raw material tank 320, and a plurality of pipes and sensors. The bubbler 310 is used for vaporizing liquid raw material (C•I) that is replenished through a designated pipe in the raw material tank 320. The vapor (V•O) inside the bubbler 310 is provided to an optical-fiber-preform deposition unit for a subsequent fabrication stage. The bubbler 310 includes an internal bubbler 311 and an external bubbler 313. The internal bubbler 311 receives carrier gas (C•G) from the outside and vaporizes the liquid raw material. Even though the raw material provided externally to the bubbler of the device 300 is supposed to be in the same state (i.e., temperature of the raw material) as the raw material inside the bubbler 310, it is difficult to control a number of external conditions or phase changes of the raw material to achieve the same condition. To this end, the external bubbler 313 is provided to reduce the temperature difference between the raw material that is replenished from the outside and the raw material inside the bubbler.

The raw material tank 320 preheats raw material (C•I) that is provided from the outside and supplies the preheated raw material to the bubbler 310. The raw material tank 320 is largely divided into an inflow unit 321 and an outflow unit 323. The inflow unit 321 is where the raw material (C•I) provided from the outside is preserved, while the outflow unit 323 is where the raw material to be provided to the bubbler 310 is preserved. This is based on the same principle applied to the bubbler 310 mounted with an internal bubbler 311 and an external bubbler 313, wherein some of the raw material (C•I) provided from the outside is separated from the raw material to be provided to the bubbler after being preheated inside the raw material tank 320, thereby making the status/condition of the raw material to be provided to the bubbler 310 similar to those of the raw material inside the bubbler 310.

The bubbler 310 and the raw material tank 320 are connected to each other through a hollow microtube 340. The hollow microtube 340 has a function of filtering any alien substance from the raw material to be provided to the bubbler 310. To reduce the providing path of the raw material from the raw material tank 320 to the bubbler 310, the bubbler 310 and the raw material tank 320 are manufactured preferably in one body and the hollow microtube 340 is installed preferably in a lower portion of the bubbler 310. In fact, the bubbler 310, the raw material tank 320, and the hollow microtube 340 are installed in thermal insulator 330 to maintain the status/condition of the raw material uniformly.

Accordingly, a raw material is provided to a raw material thank 320 from the outside, then provided to the bubbler 310 via the hallow microtube 340 after being preheated inside the raw material tank 320 at a substantially similar temperature of the inside the bubbler 310. Hence, the temperature difference between the raw material provided in the raw material tank 320 and inside the bubbler 310 is compensated in the raw material tank 320. Also, the pressure difference between the raw material supplied to the raw material tank 320 and inside the bubbler 320 is also compensated in the raw material tank 320 as the raw material is supplied to the bubbler 310 after where a constant vapor pressure is maintained inside the raw material thank 320. As such, as a new raw material is supplied from the outside, a phase change of a raw material can be maintained uniformly in the bubbler 310, without any influence that may caused by the temperature or pressure difference. If necessary, though, the thermal insulator 330 can have a heating device (not shown) for heating the raw material as the phase change of the raw material happening at the bubbler 310 is very much dependent upon the temperature of the raw material. Thus, in an alternate embodiment, it is desired to preheat the raw material in the raw material tank 320.

The deposition state of the optical-fiber preform changes depending on the vapor pressure (V•O) of the vapor provided to the deposition unit. Accordingly, it is very important to maintain a constant vapor pressure inside the bubbler 310 for obtaining a quality optical-fiber preform. A preferable way to maintain constant vapor pressure inside the bubbler 310 is by making the phase change of the raw material continue at a constant speed. However, depending on both the temperature of the raw material and the contact time of the raw material and carrier gas (C•G). The contact time is also influenced by the liquid level of the raw material. To keep the vapor pressure inside the bubbler 310 uniformly, the bubbler 310 includes a first pressure sensor 351 for sensing vapor pressure. At the same time, an inert gas (G•I) is supplied to or discharged from the raw material tank 320 as a means for adjusting the vapor pressure. That is, when the vapor pressure inside the bubbler 310 is lowered, the inert gas (G•I) is provided to the raw material tank 320. As a result, the raw material provision for the bubbler 310 is expedited and the amount of the raw material inside the bubbler 310 is increased. Furthermore, the phase change of the raw material is hastened also. Similarly, when the vapor pressure inside the bubbler 310 is increased, the inert gas inside the raw material tank 320 is discharged through a vent line 325, and the vapor pressure inside the bubbler 310 is no longer increased. Preferably, nitrogen gas is used for the inert gas (G•I) to be provided to the raw material tank 320.

To summarize, by adjusting the pressure of the raw material tank 320, it is possible to maintain the amount of the raw material inside the bubbler 310 at a constant level, induce the phase change of the raw material at a constant speed, and maintain the vapor pressure inside the bubbler uniformly. In addition, by supplying or discharging inert gas, the internal pressure of the raw material tank 320 can be adjusted, and consequently, the vapor pressure inside the bubbler 310 can be adjusted. This enables the deposition speed of an optical-fiber preform to be adjusted easily, thus creating an appropriate deposition condition for an optical-fiber preform according to the optical fiber to be prepared therefrom.

With continued reference to FIG. 3, as the deposition process is being performed, the raw material inside the raw material tank 320 is continuously depleted; therefore, whenever this happens, it is decided whether or not to replenish the raw material.

As a means for sensing the amount of the raw material inside the raw material tank 320, a second pressure sensor 353, a level sensor 355, and a load cell 357 are provided and any combination of these can be selectively used for the sending applications. For example, if the second pressure sensor 353 is used, the amount of the raw material inside the raw material tank 320 can be detected by calculating the pressure difference between the first pressure sensor 351 and the second pressure sensor 353. This can be better explained by the following Equation, which is derived from Bernoulli's theorem.

$$P_p - P_b = \rho g h_b - \rho g h_p \qquad \text{[Equation 1]}$$

Here, $P_p$ indicates an internal pressure of the raw material tank 320; $P_b$ indicates vapor pressure inside the bubbler 310; $h_b$ indicates the liquid level of the raw material inside the bubbler 310; $\rho$ indicates the density of the raw material; and g indicates gravity. As the density of the raw material, $\rho$, and the gravity, g, are the same, the pressure difference between the bubbler 310 and the raw material tank 310 is manifested through the level difference of the liquid raw material inside the bubbler 310 and the raw material tank 320. As the amount of the raw material and the vapor pressure inside the bubbler 310 are supposed to maintain at a constant level, the liquid level of the raw material tank 320 changes depending on the pressure of the raw material tank 320. Therefore, the pressure of the raw material tank 320 and the second pressure sensor 353 measured determines whether the raw material should be replenished or not.

If the liquid level of the raw material tank 320 falls below a certain height, the raw material (C•I) should be replenished from the outside, and while replenishing the raw material (C•I), inert gas inside the raw material tank 320 is discharged (G•O) to decrease the internal pressure of the raw material tank 320 gradually. The phase change of the raw material could be continued in the bubbler 310 even when the raw material is being replenished to the raw material tank 320. Also, to have enough time for preheating the replenished raw material to the raw material tank 320 while letting the deposition process continue, a large amount of the raw material should not be replenished at once to the raw material tank 320 although the liquid level therein is extremely low.

As for the level sensor 355, an optical sensor, an ultrasonic sensor, or a radiation level meter can be used. The level sensor 355 designates a minimum allowable level of the raw material inside the raw material tank 320 in advance, and if the liquid level reaches the minimum allowable level, the raw material should be replenished. While replenishing the raw material in such case, the internal pressure inside the raw material tank 320 should be gradually decreased by discharging the inert gas (G•O) therein. Note that before using the level sensor, the level sensor might make an error in sensing the liquid level as the raw material is fluid.

The load cell 357 senses the weight of the raw material inside the raw material tank 320 and decides whether the raw material needs to be replenished. The load cell 357 converts the physical changes that are generated according to the weight to electric signals. A commonly used load cell 357 behaves as a strain gauge sticking to a metal bar or a metal plate. The strain gauge detects a change in the electrical resistance from the changes in the metal bar or the metal plate according to different weights. Thus, the load cell 357 calculates any change in the weight of the raw material by sensing the change in the electrical resistance. Similar to the level sensor 355, the load cell 357 also pre-designates a minimum allowable weight of the raw material inside the raw material tank 320, so when the weight of the raw material hits the minimum allowable weight, the raw material can be replenished. Again in this case, while replenishing the raw material, the internal pressure inside the raw material tank 320 should be gradually decreased by discharging the inert gas (G•O) therein.

Alternatively, there is another method for replenishing the raw material periodically without using any means for sensing the amount of the raw material. This is possible because the raw material inside the bubbler 310 is consumed at a constant speed without any variation. Therefore, the raw material can be replenished on a regular basis while the phase change is progressing at the same time.

As described above, the present invention is different from the conventional method, in which the liquid level of the bubbler is sensed before replenishing the raw material thereto and the amount of the raw material inside of the raw material tank 320 and the internal pressure of the raw material tank 320 are adjusted, while maintaining the amount of the raw material inside the bubbler 310 and the internal pressure of the bubbler 310 constant. As such, even when the raw material is provided from the outside, the bubbler 310 is not influenced thereof at all, so the phase change the raw material goes through for deposition of an optical-fiber preform can be continued without ceasing.

In conclusion, the present invention introduces a more convenient way to replenish raw material continually to the bubbler—i.e., adjusting the internal pressure of the raw material tank. In this way, the amount of the raw material inside the bubbler can be maintained uniformly and the phase change speed is also constant. As a result thereof, any difference found in a new raw material to be provided to the bubbler could be minimized. Moreover, the present invention can prevent the raw material from being polluted by minimizing a mechanical friction in the device using a hollow microtube with a filtering function. Furthermore, the present invention adjusts the internal pressure of the raw material tank by using an inert gas, such as nitrogen, appropriately for the deposition of an optical-fiber perform which enables the vapor pressure of the bubbler to be adjusted easily. Lastly, unlike the prior art, the present invention enhances the productivity as the deposition process is performed continuously even when the raw material is being replenished additionally.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A device for providing a raw material used in a chemical-vapor deposition process, the device comprising:
    a bubbler for vaporizing a liquid raw material and providing the vaporized liquid raw material to a deposition unit; and
    a tank for preheating the liquid raw material for a subsequent delivery to the bubbler via a plurality of hollow microtubes,
    wherein an internal pressure of the tank is increased as the liquid raw material inside the bubbler is vaporized, thereby maintaining an amount of the liquid raw material and a vapor pressure inside the bubbler substantially uniform.

2. The device as claimed in claim 1, further comprising:
    a first pressure-measuring device mounted in the bubbler for measuring the vapor pressure inside the bubbler; and
    a second pressure measuring device mounted in the tank for measuring an internal pressure of the tank,
    means for selectively adjusting the internal pressure of the tank to maintain the vapor pressure of the bubbler at a constant level.

3. The device as claimed in claim 2, further comprising means for replenishing the liquid raw material in the tank if the difference between the internal pressure of the tank and the vapor pressure inside the bubbler exceeds a predetermined difference.

4. The device as claimed in claim 1, further comprising means for gradually increasing the internal pressure of the tank by providing an inert gas into the tank.

5. The device as claimed in claim 4, wherein the inert gas is nitrogen gas.

6. The device as claimed in claim 1, wherein the tank comprises a plurality of level sensors mounted therein for measuring a level of the liquid raw material and a means for replenishing the raw material into the tank if the level of the liquid raw material inside the tank falls below a predetermined level.

7. The device as claimed in claim 1, wherein the tank comprises a plurality of load cells mounted therein for measuring a weight of the liquid raw material and means for replenishing the liquid raw material into the tank if the weight of the liquid raw material inside the tank falls below a predetermined weight.

8. The device as claimed in claim 1, further comprising means for replenishing the liquid raw material periodically while being vaporized in the bubbler.

9. The device as claimed in claim 1, further comprising hollow micro-tubes filters between the tank and the bubbler to prevent any foreign substances inside the liquid raw material from being transferred to the bubbler.

10. The device as claimed in claim 1, wherein the tank, the hollow micro-tubes, and the bubbler are mounted in one thermal insulator to maintain the temperature of the liquid raw material uniformly.

11. The device as claimed in claim 1, further comprising a vent line for lowering the internal pressure of the tank if the tank becomes over pressured.

* * * * *